(12) United States Patent
Emira et al.

(10) Patent No.: US 10,742,222 B2
(45) Date of Patent: Aug. 11, 2020

(54) PEAK-ADAPTIVE SAMPLING DEMODULATION FOR RADIOFREQUENCY TRANSCEIVERS

(71) Applicant: GOODIX TECHNOLOGY INC., San Diego, CA (US)

(72) Inventors: Ahmed Emira, San Diego, CA (US); Ahmet Tekin, San Diego, CA (US); Hassan Osama Elwan, San Diego, CA (US); Janakan Sivasubramaniam, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/218,430

(22) Filed: Dec. 12, 2018

(65) Prior Publication Data

US 2020/0195256 A1    Jun. 18, 2020

(51) Int. Cl.
*H03L 7/091* (2006.01)
*H04L 7/033* (2006.01)
(Continued)

(52) U.S. Cl.
CPC ............... *H03L 7/091* (2013.01); *H03L 7/18* (2013.01); *H04B 1/403* (2013.01); *H04L 7/007* (2013.01);
(Continued)

(58) Field of Classification Search
CPC ......... H03L 7/18; H04B 1/403; H04B 5/0062; H04L 7/007; H04L 7/0331; H04L 27/2695; H04L 27/266
(Continued)

(56) References Cited

U.S. PATENT DOCUMENTS

| | | | | |
|---|---|---|---|---|
| 5,404,379 A | * | 4/1995 | Shyue | H04L 7/0029 327/155 |
| 5,930,304 A | * | 7/1999 | Hollenbeck | G06K 13/077 375/259 |

(Continued)

FOREIGN PATENT DOCUMENTS

| | | |
|---|---|---|
| CN | 107707278 A | 2/2018 |
| CN | 108306628 A | 7/2018 |

(Continued)

OTHER PUBLICATIONS

International Search Report dated Oct. 22, 2019 in the corresponding International application (application No. PCT/CN2019/096219).

(Continued)

*Primary Examiner* — Wednel Cadeau
(74) *Attorney, Agent, or Firm* — Kilpatrick Townsend & Stockton LLP

(57) ABSTRACT

Techniques are described for peak-adaptive sampling demodulation for radiofrequency transceivers. For example, a tag input signal is received via an antenna, from which a clock input signal can be extracted. Multiple clock output signals can be generated responsive to the extracted clock input signal, such that each has a different respective phase. A multiphase selector can identify the one of the clock output signals that has the respective phase that is closest to the phase of the tag input signal and is best suited for sampling the peak of the tag input signal, accordingly. A single-path detector can generate a data output signal by using the identified clock output signal to sample the tag input signal, and the detector can filter and amplify the data output signal using small-signal devices.

18 Claims, 5 Drawing Sheets

(51) Int. Cl.
    *H03L 7/18*    (2006.01)
    *H04L 27/26*    (2006.01)
    *H04L 7/00*    (2006.01)
    *H04B 1/403*    (2015.01)
    *H04B 5/00*    (2006.01)
    *H03K 5/1532*    (2006.01)

(52) U.S. Cl.
    CPC ........ *H04L 7/0331* (2013.01); *H04L 27/2695* (2013.01); *H03K 5/1532* (2013.01); *H04B 5/0062* (2013.01); *H04L 27/266* (2013.01)

(58) Field of Classification Search
    USPC ........................................................ 375/376
    See application file for complete search history.

(56) References Cited

U.S. PATENT DOCUMENTS 10,129,059 B2    11/2018    Chakraborty et al.
2008/0056419 A1    3/2008    Lee et al.
2010/0148723 A1*    6/2010    Cook ................. G06K 7/10207
                                                                         320/108
2015/0065043 A1    3/2015    Heng et al.
2015/0180502 A1    6/2015    Liu
2018/0110018 A1*    4/2018    Yu ........................ H04B 5/0031
2018/0123774 A1    5/2018    Kanda

FOREIGN PATENT DOCUMENTS

CN        108306838 A    7/2018
EP        3349298 A1    7/2018
WO    2015105600 A1    7/2015

OTHER PUBLICATIONS

European Search Report dated Mar. 4, 2020 in the corresponding EP application (application No. 19765148.2).

* cited by examiner

PEAK-ADAPTIVE SAMPLING DEMODULATION FOR RADIOFREQUENCY TRANSCEIVERS

FIELD OF THE INVENTION

The present invention relates generally to radiofrequency transceiver circuits. More particularly, embodiments of the present invention relate to peak-adaptive sampling demodulation for radiofrequency transceivers.

BACKGROUND OF THE INVENTION

In many radiofrequency circuit applications, such as radiofrequency identification (RFID) tag and reader circuits, it is desirable to have reliable symbol detection mechanisms that consume low power and small area. Many conventional approaches to symbol detection in radiofrequency circuit applications tend to use so called "IQ" demodulation. IQ demodulation approaches generally include two detection paths, each using a phase-shifted version of a detector clock (e.g., local oscillator clock). For example, an "I" detection path may use an in-phase version of the detector clock signal, while a "Q" detection path may use an out-of-phase (e.g., phase-shifted by ninety degrees) version of the detector clock signal. Using dual detector paths can provide a number of features, such as distinguishing between a received signal frequency being greater or less than the frequency of the detector clock signal. However, implementing two detector paths typically involves implementing two copies of the components of the detection path, which can effectively double the power and area consumption of the detection circuit. Some other conventional approaches to symbol detection in radiofrequency circuit applications tend to use so-called "envelope detection." While envelope detection can be implemented without the dual detection paths of IQ approaches, envelope detection circuits typically rely on using large-signal devices. The large signal devices tend to consume more area and more power, and can often provide less accurate detection than their small-signal counterparts.

BRIEF SUMMARY OF THE INVENTION

Embodiments include circuits, devices, and methods for peak-adaptive sampling demodulation for radiofrequency transceivers. Some embodiments operate in context of radiofrequency identification (RFID) integrated circuits, such as for RFID tags and/or RFID readers, to reliably detect symbols (e.g., bit data) with reduced power and area consumption over conventional approaches. For example, a tag input signal is received via an antenna, from which a clock input signal can be extracted. Multiple clock output signals can be generated responsive to the extracted clock input signal, such that each has a different respective phase. A multiphase selector can identify the one of the clock output signals that has the respective phase that is closest to the phase of the tag input signal (being best suited for sampling the peak of the tag input signal, accordingly). A single-path detector can generate a data output signal by using the identified clock output signal to sample the tag input signal, and the detector can filter and amplify the data output signal using small-signal devices.

According to one set of embodiments, a radiofrequency transceiver system is provided. The system includes: an antenna to receive a radiofrequency tag input signal; a clock extractor coupled with the antenna to extract a clock input signal from the tag input signal; an oscillator controller coupled with the clock extractor to generate multiple clock output signals responsive to the clock input signal, each clock output signal having a different respective phase; a multiphase selector coupled with the antenna and the oscillator controller to output one of the multiple clock output signals as a peak sampling clock signal, the respective phase of the one of the multiple clock output signals determined to be closest, relative to others of the multiple clock output signals, to a phase of the tag input signal; and a single-path detector coupled with the antenna and the multiphase selector to output a data output signal generated by sampling the tag input signal responsive to the peak sampling clock signal.

According to another set of embodiments, a system is provided for peak-adaptive sampling demodulation in a radiofrequency transceiver. The system includes: means for generating multiple clock output signals responsive to a clock input signal extracted from a received tag input signal, each clock output signal generated to have a different respective phase; means for selectively outputting one of the multiple clock output signals in response to determining that the one of the multiple clock output signals has the respective phase that is closest, relative to the respective phases of others of the multiple clock output signals, to a phase of the tag input signal; and means for outputting a data output signal generated by sampling the tag input signal responsive to the one of the multiple clock output signals.

According to another set of embodiments, a method is provided for peak-adaptive sampling demodulation in a radiofrequency transceiver. The method includes: receiving a tag input signal; extracting a clock input signal from the tag input signal; generating multiple clock output signals responsive to the clock input signal, each clock output signal having a different respective phase; determining one of the multiple clock output signals as having the respective phase that is closest, relative to the respective phases of others of the multiple clock output signals, to a phase of the tag input signal; outputting a peak sampling clock signal corresponding to the one of the multiple clock output signals; and outputting a data output signal generated by sampling the tag input signal responsive to the peak sampling clock signal.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
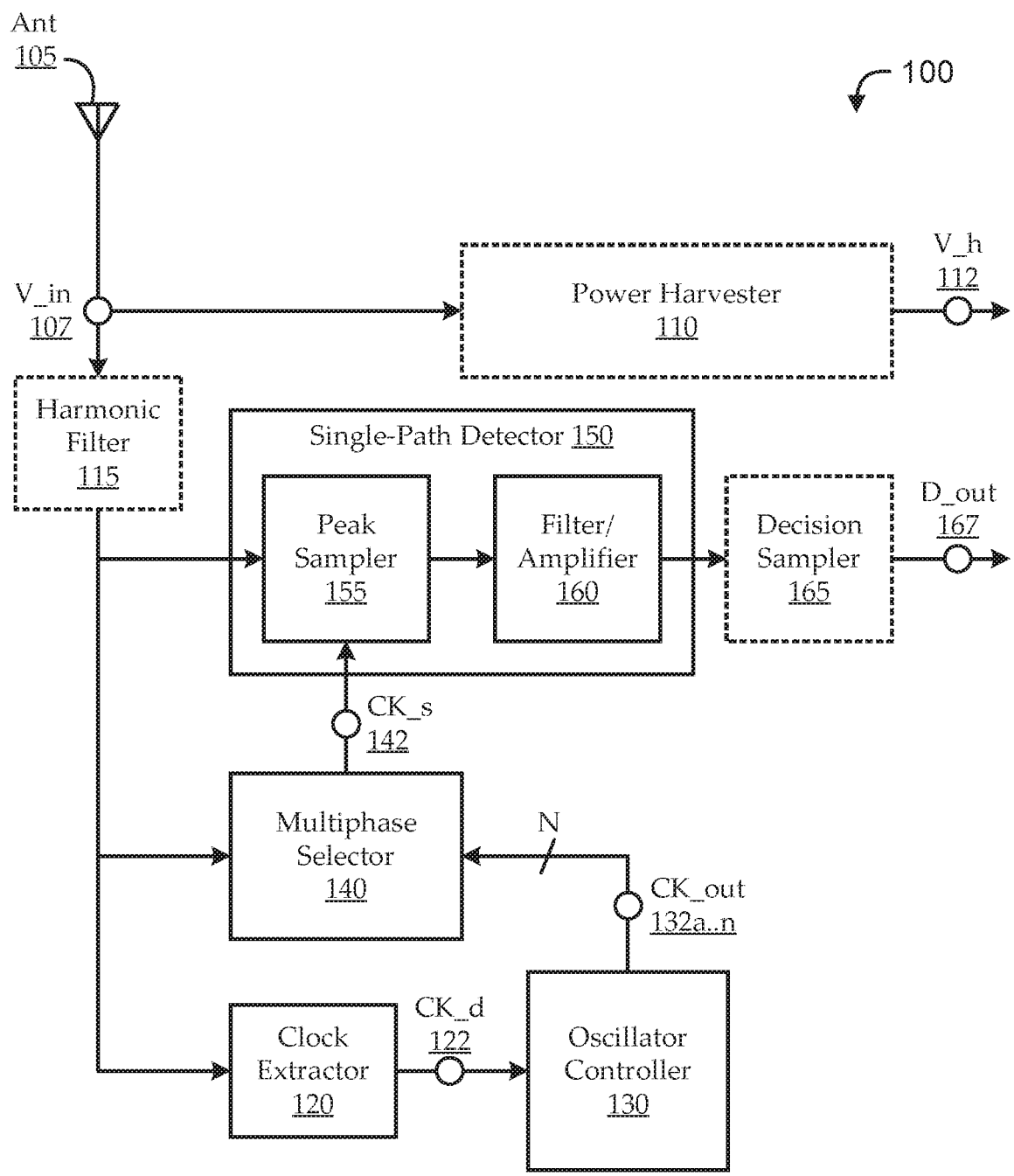
FIG. 1 shows an illustrative radiofrequency receiver system, according to various embodiments.

FIG. 1 shows an illustrative radiofrequency receiver system 100, according to various embodiments. In some embodiments, the radiofrequency receiver system 100 is part of a radiofrequency identification (RFID) integrated circuit, such as a RFID tag and/or RFID reader. An RFID tag typically includes an antenna (e.g., by which to communicate with a reader) and an integrated circuit for storing data, processing data, and modulating/demodulating data for communication via the antenna. RFID tags can also include power source components and/or power harvesting components. For example, RFID tags can typically be implemented as passive tags (i.e., having no integrated power source), fully active tags (e.g., powered by an integrated power source), or battery-assisted passive (BAP) tags (e.g., primarily passive, but assisted by a small, integrated power source). RFID readers can read RFID tags in different ways, depending on the type of RFID tag. For example, with a passive RFID tag or BAP tag, the RFID reader can transmit an interrogation signal to the RFID tag, and the RFID tag can respond by transmitting its stored identifiers and/or other data back to the RFID reader (e.g., using power harvested by the RFID tag from the received interrogation signal). Some active RFID tags periodically transmit their stored identifiers and/or other data; and RFID readers for such RFID tags may simply listen for the transmission from the tag without first transmitting an interrogation signal to the tag.

Embodiments include an antenna 105 to receive a radiofrequency tag input signal (labeled V_in) 107. Though not shown, the antenna 105 can be configured to communicate over a wireless channel in a particular frequency band. For example, the antenna 105 can be designed for RFID communications, which can involve short-range wireless communications at approximately 13.56 Megahertz. The antenna 105 can include any suitable components to facilitate communications, such as one or more coils, resonator circuits, filters, etc. The tag input signal 107 is typically an analog signal that includes digital bit data. For example, the tag input signal 107 can be an interrogation signal received from an RFID reader, a response signal received from an RFID tag, or any other suitable signal; and the signal can include a digital bit stream (e.g., tag identification data) modulated onto a carrier using amplitude-shift keyed (ASK) modulation, or any other suitable scheme. For many receiver applications, including RFID applications, it can be desirable to provide reliable symbol detection. However, reliable symbol detection can be difficult to implement, particularly in context of certain design considerations and constraints, such as when the frequency and/or phase of a carrier wave changes over time (even slightly), and/or when there are constraints on power and area.

Depending on the carrier, the modulation scheme, and/or other characteristics of the tag input signal 107, each symbol (e.g., bit or set of bits) is typically received in accordance with particular timing. The timing can define, for example, how quickly symbols are being received (e.g., a symbol frequency) and/or for how long each symbol is represented (e.g., a symbol duration). For example, in ASK modulation, each binary bit of a digital data stream can be encoded as a corresponding amplitude modulation of a high-frequency carrier for some duration (e.g., the amplitude of the carrier can be at a first level for a duration to represent a '1' and at a second level for the duration to represent a '0'). Demodulating such a signal can involve sampling the signal in many sampling locations, determining the amplitude of the signal at each of the sampling locations, and thereby determining the corresponding bit value at each of the sampling locations. However, the reliability of such demodulation can depend on the selected sampling locations. If the signal is sampled at each peak, the resulting demodulation can produce accurate symbol detection; but if the signal is sampled away from its peak, the resulting demodulation may not produce accurate symbol detection. For example, if a '1' is encoded by modulating the carrier to a relatively high amplitude level, and the signal is sampled at or near a zero-crossing location (i.e., where the amplitude is low), the detected symbol may be incorrectly interpreted as a '0'.

Various conventional approaches seek to reliably detect symbols in such contexts, such as by using so-called "IQ demodulation" and/or "envelope sampling" techniques. IQ demodulation uses multiple separate detection paths (typically at least an "I" path and a "Q" path). The multiple detection paths typically apply multiple different sampling clock phases to respective copies of most, or all, detection circuit components to generate additional detection information for improved detection accuracy. While IQ demodulation can be effective, the multiple detection paths can tend to consume appreciably more area and power. Envelope detection techniques typically extract an envelope from the received signal and sample the envelope. Such approaches often yield less accurate detection, and they typically rely on using large-signal devices, which tend to be larger (and therefore tend to consume more area and power).

Embodiments described herein seek to provide reliable symbol detection with reduced area and power consumption over conventional approaches. For example, embodiments can be implemented with a single detection path (e.g., unlike in conventional IQ demodulation approaches, or the like) and small-signal detection components (e.g., unlike in conventional envelope sampling approaches). Some embodiments operate in context of RFID circuits, for example, as part of an RFID tag circuit and/or an RFID reader circuit. According to some implementations described herein, multiple clock signals are generated responsive to a received RFID signal to have different phases, thereby effectively generating multiple narrow pulses at and/or around the peak of the received RFID signal. Samples corresponding to the multiple clock signals can be compared to select one of the clock signals as the best clock signal to use for peak sampling of the received RFID signal. The selected clock signal can be used to sample the received RFID signal, and the sampled signal can be down-converted and amplified/filtered to generate a data output signal.

Embodiments of the radiofrequency receiver system 100 include a clock extractor 120, a multiphase selector 140, and a single-path detector 150, which can all be coupled with the antenna 105. Embodiments of the clock extractor 120 can be coupled with the antenna 105 to extract a clock input signal 122 from the tag input signal 107. In one implementation, the clock extractor 120 includes a clock data recovery (CDR) circuit. In general, the clock extractor 120 extracts the clock input signal 122 in such a way that a frequency of the clock input signal 122 corresponds to a symbol frequency of the tag input signal 107.

An oscillator controller 130 can be coupled with the clock extractor 120 to generate multiple clock output signals 132 responsive to the clock input signal 122 in such a way that each clock output signal 132 has a different respective phase. In some implementations, the oscillator controller 130 includes a fractional-N phase-locked loop (PLL) circuit to oscillate, responsive to the clock input signal 122, at a PLL frequency that is approximately N times a frequency (the carrier frequency) of the tag input signal, where N is a positive integer. In one such implementation, the carrier frequency of the tag input signal 107 is approximately 13.56 Megahertz, and N is eight, such that the PLL oscillates at approximately 108.48 Megahertz. For example, in such an implementation, the PLL can output eight clock output signals 132 having eight different respective phases, such that each of the eight clock signals peaks at a different point during each single period of the carrier.

Embodiments of the multiphase selector 140 are coupled with the oscillator controller 130 to output one of the clock output signals 132 as a peak sampling clock signal 142. The peak sampling clock signal 142 is selected as the one of the clock output signals 132 that has the respective phase determined to be closest, relative to the others of the clock output signals 132, to a phase of the tag input signal 107. As described above, symbol detection accuracy can depend, at least partially, on sampling the tag input signal 107 close to its peak. Accordingly, the peak sampling clock signal 142 can be selected to most closely line up with the peak of the tag input signal 107. In one implementation, sampling is triggered by a rising edge of the peak sampling clock signal 142, and the peak sampling clock signal 142 is selected so that its rising edge most closely lines up with the peak of the tag input signal 107 (relative to the rising edges of the other clock output signals 132). In another implementation, sampling is triggered by a falling edge of the peak sampling clock signal 142, and the peak sampling clock signal 142 is selected so that its falling edge most closely lines up with the peak of the tag input signal 107. In another implementation, sampling is triggered by a peak of the peak sampling clock signal 142, and the peak sampling clock signal 142 is selected so that its peak most closely lines up with the peak of the tag input signal 107.

Figure 2:
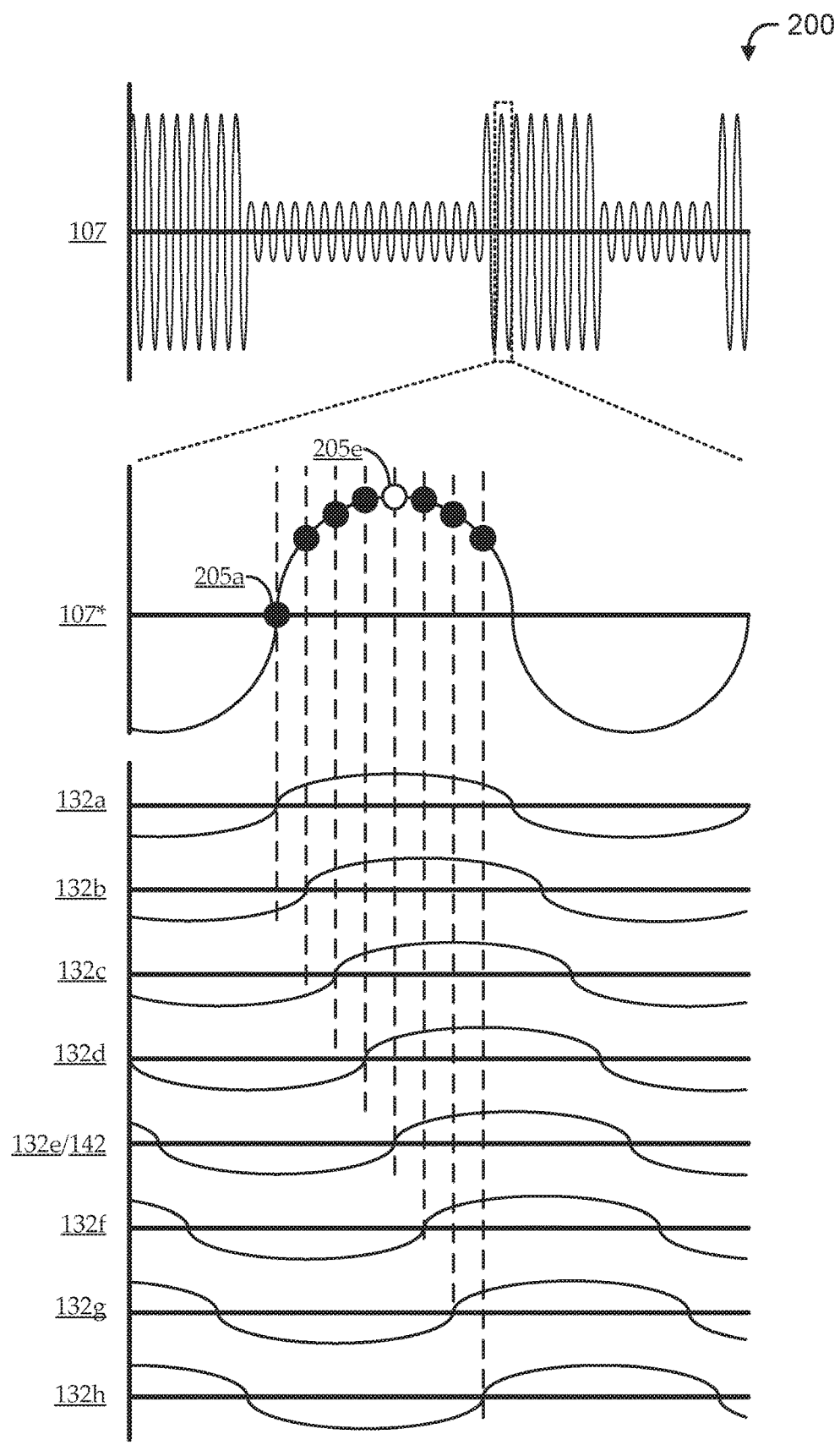
FIG. 2 shows a set of example plots to illustrate selection of the peak sampling clock signal, according to one embodiment.

FIG. 2 shows a set of example plots 200 to illustrate selection of the peak sampling clock signal 142, according to one embodiment. As illustrated, the tag input signal 107 can be an amplitude-modulated signal, such as an ASK-modulated signal (e.g., regions with higher amplitude correspond to logical '1', while regions with lower amplitude correspond to logical '0'). A zoomed-in view of a portion of the tag input signal 107 is shown as 107*. Clock output signals 132a . . . h illustrate eight example clock output signals 132 generated by an embodiment of the oscillator controller 130. Plot 107* shows sample points 205 corresponding to a sample of the tag input signal 107 taken at the rising transition (or falling transition, in an alternative implementation) of each clock output signal 132, respectively. For example, sample point 205a corresponds to a sample of tag input signal 107 triggered by the rising edge of clock output signal 132a. Notably, the different phases of the different clock output signals 132 cause samples triggered by those different clock output signals 132 to be taken in different locations along the tag input signal 107 (at eight different locations in a half-period of tag input signal 107 in the illustrated example). In the example, the sample point 205e, corresponding to the sample of tag input signal 107 triggered by the peak of clock output signal 132e, is closest to the peak of tag input signal 107. Accordingly, embodiments of the multiphase selector 140 can select clock output signal 132e to be the peak sampling clock signal 142. In some embodiments, the multiphase selector 140 obtains the sample points corresponding to some or all of the clock output signals 132 and compares their values to see which is greatest. As illustrated in FIG. 2, such an approach would properly result in selecting clock output signal 132e as the peak sampling clock signal 142.

Returning to FIG. 1, different embodiments of the multiphase selector 140 can determine which clock output signal 132 to use as the peak sampling clock signal 142 at different times. In some implementations, the multiphase selector 140 determines which clock output signal 132 to use as the peak sampling clock signal 142 one time; and the same peak sampling clock signal 142 continues to be used until a trigger event occurs (e.g., another component detects a symbol detection error, or the like). In other implementations, the multiphase selector 140 continually determines which clock output signal 132 to use as the peak sampling clock signal 142 in each clock cycle; thereby continually and dynamically updating the determination. In other implementations, the multiphase selector 140 periodically determines which clock output signal 132 to use as the peak sampling clock signal 142, for example, according to a predetermined schedule (e.g., directed by a state machine, processor, or the like). In other implementations, the multiphase selector 140 determines which clock output signal 132 to use as the peak sampling clock signal 142 in response to an external trigger, such as an instruction received from a computational routine (e.g., start-up of the receiver, etc.).

Embodiments of the single-path detector 150 can be coupled with the multiphase selector 140 to output a data output signal 167 generated by sampling the tag input signal 107 responsive to the peak sampling clock signal 142. The single-path detector 150 can include a peak sampler 155 and a filter/amplifier 160. The peak sampler 155 can receive the tag input signal 107 and can be triggered by the peak sampling clock signal 142. As described above, the peak sampling clock signal 142 is selected, so that, when it is used to trigger sampling of the tag input signal 107, the samples are obtained close to the peak of the tag input signal 107.

Embodiments of the peak sampler 155 can pass the sampled data signal to the filter/amplifier 160. Embodiments of the filter/amplifier 160 can filter and amplify the sampled data signal, as desired, to generate the data output signal 167. In some implementations, the filter/amplifier 160 performs carrier demodulation to effectively generate a low-signal sampled data signal. Such implementations can include low-signal filtering, amplifying, and/or other components for processing the low-signal sampled data signal into the data output signal 167; thereby avoiding reliance on large-signal components in the detection path. Some embodiments can further include a decision sampler 165 (e.g., as part of the single-path detector 150, or as a separate component). The decision sampler 165 can include any suitable components to further process the sampled data signal into the data output signal 167, such as to convert an analog sampled data signal into a digital data output signal 167 and/or to improve accuracy of symbol recovery, etc.

Some embodiments of the radiofrequency receiver system 100 include additional components. In some embodiments, a harmonic filter 115 is coupled with the antenna 105. For example, level control can tend to distort the signal received via the tag input signal 107, and narrow sampling can tend to be impacted by harmonics. The harmonic filter 115 can tend to reduce or eliminate the presence of such harmonics, thereby improving symbol detection accuracy. In such embodiments, some or all of the clock extractor 120, the multiphase selector 140, and the single-path detector 150 can each be coupled with the antenna 105 via the harmonic filter 115.

Some embodiments of the radiofrequency receiver system 100 also include a power harvester 110. For example, as described above, some RFID applications are partially or completely passive, such that they harvest some or all of the power used by components of the circuits from the signals received by those circuits. Embodiments of the power harvester 110 can be coupled with the antenna 105 to generate a voltage output signal 112 by harvesting power from the tag input signal 107.

Figure 3:
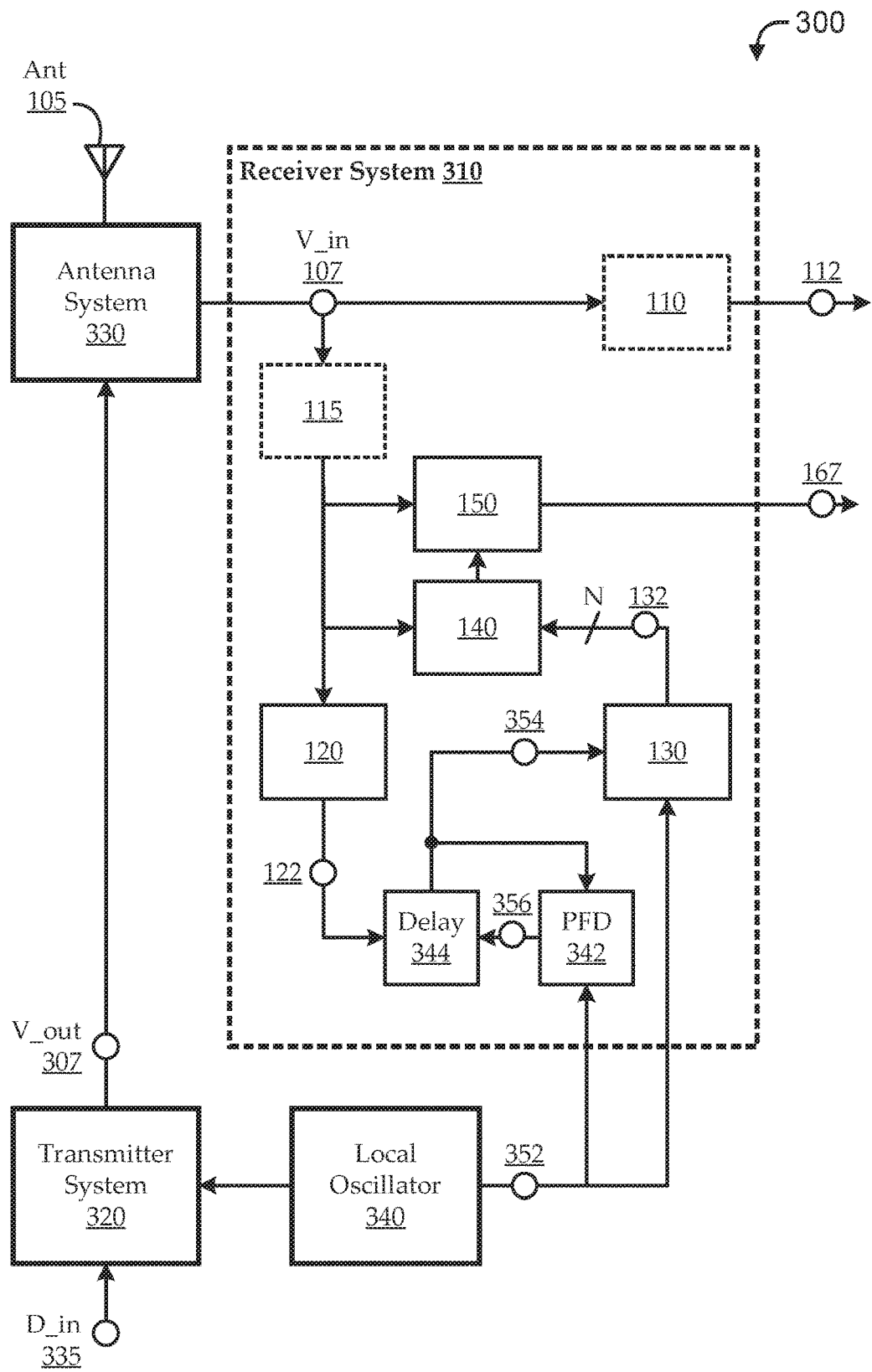
FIG. 3 shows a radiofrequency transceiver system having both receiver and transmitter functionality, according to various embodiments.

The radiofrequency receiver system 100 described with reference to FIG. 1 can be used, for example, in context of a tag-only RFID application, or in other applications that operate with a receiver and no transmitter. Other applications, such as applications including RFID reader functionality, can include additional components. FIG. 3 shows a radiofrequency transceiver system 300 having both receiver and transmitter functionality, according to various embodiments. The radiofrequency transceiver system 300 includes a receiver system 310, a transmitter system 320, an antenna system 330, and a local oscillator 340. The receiver system 310 can be an implementation of the radiofrequency receiver system 100 of FIG. 1, with slight modifications, as described below. For example, a tag input signal 107 can be received by via the antenna 105. Some embodiments can harmonically filter the tag input signal 107 using the harmonic filter 115 and/or harvest power from the tag input signal 107 using the power harvester 110 (to generate a voltage output signal 112). The clock extractor 120 can extract a clock input signal 122 from the tag input signal 107, and the oscillator controller 130 can use the extracted clock input signal 122 to generate multiple clock output signals 132. The multiphase selector 140 can determine which of the clock output signals 132 to use as the peak sampling clock signal 142, and the single-path detector 150 can generate a data output signal 167 by using the peak sampling clock signal 142 to sample the tag input signal 107.

Embodiments of the transmitter system 320 can be a radiofrequency transmitter system. For example, the transmitter system 320 can operate to transmit RFID interrogation signals as part of a RFID reader (e.g., the response to which being detectable, in some implementations, using the receiver system 310). The transmitter system 320 can include any suitable components for generating a reader output signal 307 responsive to a data input signal 335. For example, the transmitter system 320 can include amplifiers, filters, modulators (e.g., to generate an ASK-modulated signal), etc.).

Embodiments of the antenna system 330 can include any suitable components for interfacing with the receiver system 310 and the transmitter system 320. In one embodiment, the antenna system 330 includes the antenna 105 and an interface to which the receiver system 310 and the transmitter system 320 are both coupled. In other embodiments, the antenna system 330 includes components by which the antenna 105 can be selectively coupled with each of the receiver system 310 and the transmitter system 320. Some implementations of the antenna system 330 include components, such as filters, amplifiers, buffers, and the like, to help improve signal coupling properties (e.g., impedance matching, etc.) with the receiver system 310, the transmitter system 320, wired or wireless transmission channels, etc.

Embodiments of the local oscillator 340 can be implemented in any suitable manner to produce one or more reliable reference clock signals 352. In some implementations, the local oscillator 340 includes a crystal oscillator circuit. For example, the local oscillator 340 is implemented with a resonating crystal coupled with a voltage-controlled oscillator; and the resonating crystal is designed to resonate reliably at a desired reference clock signal 352 frequency. In some implementations, the local oscillator 340 is coupled with the transmitter system 320 to produce a carrier signal onto which a data input signal 335 is modulated to generate a reader output signal 307. Additionally or alternatively, embodiments of the local oscillator 340 generate a reference clock signal 352. In such implementations, the oscillator controller 130 is further coupled with the local oscillator 340 to generate the clock output signals 132 further responsive to the reference clock signal 352. In some such implementations, the receiver system 310 further includes a delay controller 344 and a phase frequency detector 342. As illustrated, the delay controller 344 can be coupled with the clock extractor 120 to output a delayed clock input signal 354 by applying an adjustable phase delay to the clock input signal 122. The adjustable phase delay can be responsive to a delay control signal 356. The phase frequency detector 342 can be coupled with the local oscillator 340 and the delay controller 344 to generate the delay control signal 356 responsive to comparing the reference clock signal 352 and the delayed clock input signal 354. Rather than receiving the clock input signal 322 directly, the oscillator controller 130 can be coupled with the clock extractor 120 via the delay controller 344 to receive the delayed clock input signal 354. Coupled in such a manner, the oscillator controller 130 can effectively be phase-synchronized according to the delayed clock input signal 354, and the oscillator controller 130 can effectively be frequency-synchronized according to the reference clock signal 352.

The systems described in FIGS. 1 and 3 can be implemented in any suitable manner using any suitable circuit components, or the like. In some embodiments, the system described in FIGS. 1 and/or 3 is a system for peak-adaptive sampling demodulation in a radiofrequency transceiver. Such systems can include any suitable means for generating clock output signals responsive to a clock input signal extracted from a received tag input signal, in such a way that each clock output signal is generated to have a different respective phase. Such systems can also include any suitable means for selectively outputting one of the plurality of clock output signals in response to determining that the one of the clock output signals has the respective phase that is closest, relative to the respective phases of others of the clock output signals, to a phase of the tag input signal. Such systems can also include any suitable means for outputting a data output signal generated by sampling the tag input signal responsive to the one of the plurality of clock output signals.

Figure 4:
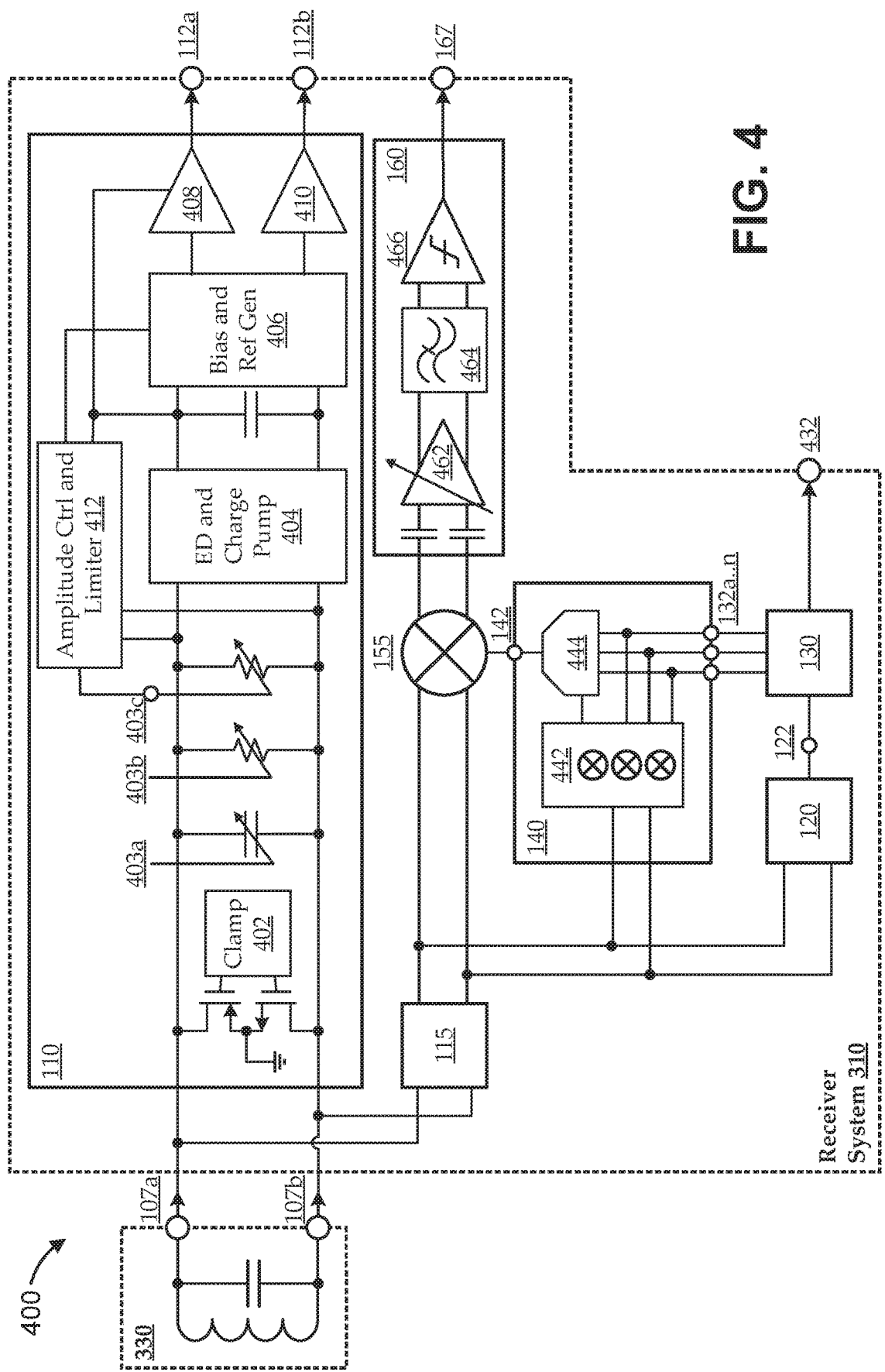
FIG. 4 shows a circuit diagram for implementing portions of a radiofrequency transceiver system, according to various embodiments.

FIG. 4 shows a circuit diagram 400 for implementing portions of a radiofrequency transceiver system, such as described with reference to FIG. 3, according to various embodiments. The circuit diagram 400 includes an embodiments of a receiver system 310 and an antenna system 330, which can include implementations of components of those respective systems as discussed with reference to FIGS. 1 and 3 above. Though not shown, embodiments of the circuit diagram 400 can include a transmitter system coupled with the antenna system 330, a local oscillator 340 coupled with the oscillator controller 130 and/or the transmitter system, and/or any other suitable components.

As illustrated, the antenna system can include a resonator (e.g., a coil) tuned to resonate at one or more particular frequencies, such as at a desired carrier frequency. Implementations include a capacitor coupled across the resonator, and/or other suitable circuit components. Some implementations can include complementary terminals, such that the received tag input signal 107 is received as differential signals 107a and 107b (i.e., tag input signal 107a is complementary to tag input signal 107b). Receiving the tag input signal 107 as a differential signal can provide various features, such as permitting a common mode of the tag input signal 107 to be detected and removed for more accurate processing.

Embodiments of the receiver system 310 can include a power harvester 110, a harmonic filter 115, a clock extractor 120, an oscillator controller 130, a multiphase selector 140, a peak sampler 155, and a filter/amplifier 160 (e.g., the peak sampler 155 and the filter/amplifier 160 can make up a single-path detector 150, as described above). Embodiments of the power harvester 110 can include a number of stages and components to harvest power from the received tag input signal 107. For example, the power harvester 110 converts the received radiofrequency (RF) signal into a direct current (DC) signal, or the like, and then performs boosting and power conditioning on the DC signal to generate one or more output voltage signals. As illustrated, the first stages can include a hard clamp 402 and a variable parallel RC (resistor-capacitor) network having resistor and capacitors controlled by various control signals 403. These first stages can act as a RF-to-DC converter. The converted DC signal can be passed to an amplitude control and limiter stage 412 and to an envelope detector and charge pump stage 404. Feedback from the amplitude control and limiter stage 412 can be used to adjust one or more control signals 403 for the parallel RC network. Outputs from the amplitude control and limiter stage 412 and from the envelope detector and charge pump stage 404 can be used to generate a high-level voltage output signal (e.g., to charge a capacitor to that level). The outputs from the amplitude control and limiter stage 412 and from the envelope detector and charge pump stage 404 can also be passed to a bias and reference generator stage 406. Responsive to those outputs, the bias and reference generator stage 406 can generate one or more voltage outputs, such as an analog voltage output and a digital voltage output. Each can pass through a respective regulator (e.g., a low drop-out, or LDO, regulator) to generate a respective voltage output signal 112. For example, an analog voltage output can be passed to an analog low drop-out (LDO) regulator to generate an analog voltage output signal 112a, and a digital voltage output can be passed to a digital LDO regulator to generate a digital voltage output signal 112b.

The detector path of the receiver system 310 can operate as described herein with reference to FIGS. 1-3 and 5. For example, the tag input signal 107 (differential tag input signals 107a and 107b) can be received by via the antenna system 330. The tag input signal 107 can be passed through the harmonic filter 115 to remove or mitigate any unwanted harmonics. The clock extractor 120 can extract a clock input signal 122 from the tag input signal 107. In some embodiments, the clock extractor 120 includes a clock data recovery (CDR) circuit, or the like. The oscillator controller 130 can use the extracted clock input signal 122 to generate multiple clock output signals 132. Only three clock output signals 132 are shown to avoid overcomplicating the illustration, but any suitable number of clock output signals 132 can be used. In some implementations, the number of clock output signals 132 is a power of two (e.g., 2^3=8) to facilitate operability with certain digital circuit components. Each of the generated clock output signals 132 has a different phase relative to a phase of the tag input signal 107 (e.g., and relative to the phase of the clock input signal extracted therefrom).

The multiphase selector 140 can include a multiphase sample comparator 442 and a multiplexer 444. The multiphase sample comparator 442 receives the tag input signal 107 at one set of inputs and receives the multiple clock output signals 132 at another set of inputs as candidate peak sample clocks. In some implementations, only certain of the generated clock output signals 132 are passed to the multiphase sample comparator 442 as candidate peak sample clocks, for example, where it is known that certain of the output phases generated by the oscillator controller 130 are not close to the desired sampling phase. The multiphase sample comparator 442 can obtain one or more samples of the tag input signal 107 using each of the clock output signals 132 received as candidate peak sample clocks (e.g., as illustrated in FIG. 2). The various samples can be compared to determine which received one of the clock output signals 132 is apparently generating a sample closest to the peak of the tag input signal 107. For example, the amplitude of each sample can be compared to determine which sample has the largest amplitude; that sample can be assumed to be closest to the peak of the tag input signal 107; and the clock output signal 132 by which that sample was generated can be determined as a best clock output signal 132 to use for sampling the tag input signal 107 at its peak. Accordingly, the determined one of the clock output signals 132 can be identified for use as the peak sampling clock signal 142. The multiphase sample comparator 442 can output a selector signal that corresponds to the one of the clock output signals 132 identified for use as the peak sampling clock signal 142. For example, if the fifth clock output signal 132 is identified for use as the peak sampling clock signal 142, the multiphase sample comparator 442 can output the selector signal to indicate the fifth clock output signal 132 (e.g., by outputting the selector signal as a binary '101').

Embodiments of the multiplexer 444 can output one of the clock output signals 132 in accordance with a control input. In some implementations, the multiplexer 444 receives the clock output signals 132 (e.g., or only certain ones of the clock output signals 132 predetermined as candidate peak sample clocks) at a set of selection inputs, and receives the selector signal from the multiphase sample comparator 442 at a control input. Accordingly, the multiplexer 444 can output the one of the clock output signals 132 indicated by the selector signal, which is the peak sampling clock signal 142.

Embodiments of the peak sampler 155 can receive the tag input signal 107 at one set of inputs, and can receive the peak sampling clock signal 142 at another input. The peak sampler 155 can generate a sampled data signal by sampling the tag input signal 107 in accordance with the peak sampling clock signal 142. For example, each peak of the peak sampling clock signal 142 can trigger the peak sampler 155 to obtain a sample of the tag input signal 107, and the obtained sample is output via the sampled data signal. The sampled data signal can then be processed into a data output signal 167 by the filter/amplifier 160. The filter/amplifier 160 can include any suitable filtering and/or amplifying components. For example, as illustrated, the sampled data signal can be passed, via in-line capacitors, to a variable gain amplifier 462, a low-pass filter 464, and an analog comparator 466. Some embodiments of the filter/amplifier 160 include, or are coupled with, additional components, such as an analog-to-digital converter. In some embodiments, the output of the filter/amplifier 160 is the data output signal 167. In other embodiments, the filter/amplifier 160 includes, or is coupled with, additional components to further process the sampled data signal into the data output signal 167. For example, some embodiments include an analog-to-digital converter to convert the analog output of the analog comparator 466 to a digital data output signal 167.

Figure 5:
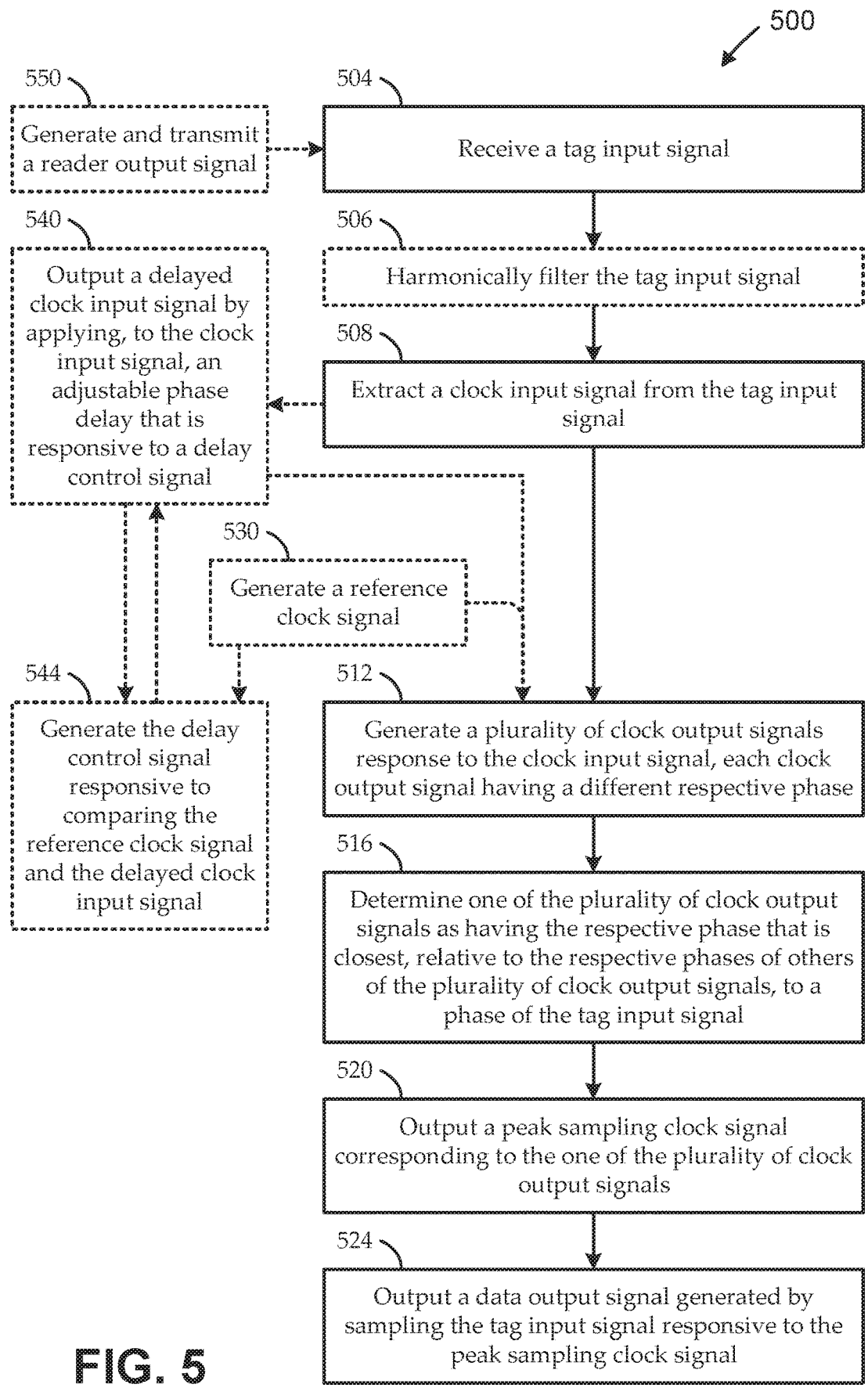
FIG. 5 shows a flow diagram of an illustrative method for peak-adaptive sampling demodulation in a radiofrequency transceiver, according to various embodiments.

FIG. 5 shows a flow diagram of an illustrative method 500 for peak-adaptive sampling demodulation in a radiofrequency transceiver, according to various embodiments. Embodiments of the method 500 begin at stage 504 by receiving a tag input signal (e.g., any suitable input signal that includes modulated symbol data). In some embodiments, the method 500 begins at stage 550 by generating a reader output signal (e.g., a RFID reader interrogation signal), and transmitting the reader output signal by an antenna over a radiofrequency communication channel. In some such embodiments, the tag input signal can be received at stage 504 by the antenna over the radiofrequency communication channel in response to the transmitting at stage 550.

At stage 508, embodiments can extract a clock input signal from the tag input signal. At stage 512, embodiments can generate multiple clock output signals responsive to the clock input signal, such that each clock output signal has a different respective phase. In some embodiments, the generating at stage 512 includes generating N clock output signals to each have a respective one of N phases using a fractional-N phase-locked loop (PLL) that oscillates, responsive to the clock input signal, at a PLL frequency that is approximately N times a frequency of the tag input signal, N being a positive integer.

Some embodiments of the method 500 include generating a reference clock signal by a local oscillator at stage 530. In such embodiments, the generating at stage 512 can be further responsive to the reference clock signal. Some such embodiments can further output a delayed clock input signal at stage 540 by applying, to the clock input signal, an adjustable phase delay that is responsive to a delay control signal. At stage 544, the delay control signal can be generated responsive to comparing the reference clock signal and the delayed clock input signal. In such embodiments, the clock input signal can be received as the delayed clock input signal, such that the generating at stage 512 includes phase-synchronizing the clock output signals according to the delayed clock input signal and frequency-synchronizing the clock output signals according to the reference clock signal.

At stage 516, embodiments can determine one of the clock output signals as having the respective phase that is closest, relative to the respective phases of the other clock output signals, to a phase of the tag input signal. At stage 520, embodiments can output a peak sampling clock signal corresponding to the one of the plurality of clock output signals determined in stage 516. At stage 524, embodiments can output a data output signal generated by sampling the tag input signal responsive to the peak sampling clock signal. In some embodiments, the outputting at stage 524 includes sampling the tag input signal responsive to the peak sampling clock signal to generate a sampled data signal, and generating the data output signal by filtering and amplifying the sampled data signal. Some embodiments can harmonically filter the tag input signal at stage 506. Such embodiments can perform the harmonic filtering prior to any or all of the extracting at stage 508, the determining at stage 516, the outputting at stage 520, and the outputting at stage 524.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. An radiofrequency transceiver system comprising:
   an antenna to receive a radiofrequency tag input signal;
   a clock extractor coupled with the antenna to extract a clock input signal from the tag input signal;

a delay controller coupled with the clock extractor to output a delayed clock input signal by applying, to the clock input signal, an adjustable phase delay that is responsive to a delay control signal;

a phase frequency detector coupled with the delay controller to generate the delay control signal responsive to comparing the delayed clock input signal with a reference clock signal;

an oscillator controller coupled with the clock extractor via the delay controller to generate a plurality of clock output signals responsive to the delayed clock input signal, each clock output signal having a different respective phase, such that the oscillator controller is phase-synchronized according to the delayed clock input signal and the oscillator controller is frequency-synchronized according to the reference clock signal;

a multiphase selector coupled with the antenna and the oscillator controller to output one of the plurality of clock output signals as a peak sampling clock signal, the respective phase of the one of the plurality of clock output signals determined to be closest, relative to others of the plurality of clock output signals, to a phase of the tag input signal; and a single-path detector coupled with the antenna and the multiphase selector to output a data output signal generated by sampling the tag input signal responsive to the peak sampling clock signal.

2. The radiofrequency transceiver system of claim 1, further comprising:

a harmonic filter coupled with the antenna, wherein the clock extractor, the multiphase selector, and the single-path detector, are each coupled with the antenna via the harmonic filter.

3. The radiofrequency transceiver system of claim 1, wherein the single-path detector comprises:

a peak sampler coupled with the antenna and the multiphase selector to sample the tag input signal responsive to the peak sampling clock signal to generate a sampled data signal; and a low-signal amplifier coupled with the peak sampler to generate the data output signal by filtering and amplifying the sampled data signal.

4. The radiofrequency transceiver system of claim 1, wherein the oscillator controller comprises a fractional-N phase-locked loop (PLL) circuit to oscillate, responsive to the clock input signal, at a PLL frequency that is approximately N times a frequency of the tag input signal, and to generate N clock output signals to each have a respective one of N phases, N being a positive integer.

5. The radiofrequency transceiver system of claim 1, further comprising:

a local oscillator to generate the reference clock signal, wherein the oscillator controller is further coupled with the local oscillator to generate the plurality of clock output signals further responsive to the reference clock signal.

6. The radiofrequency transceiver system of claim 1, wherein the tag input signal is a radiofrequency identification (RFID) signal received in an RFID frequency band.

7. The radiofrequency transceiver system of claim 1, further comprising:

a power harvester coupled with the antenna to generate a voltage output signal by harvesting power from the tag input signal.

8. The radiofrequency transceiver system of claim 1, wherein the single-path detector further comprises:

a decision sampler coupled with the single-path detector to generate a bit stream responsive to the data output signal.

9. The radiofrequency transceiver system of claim 1, further comprising:

a transmitter system to generate a reader output signal responsive to a data input signal, wherein the antenna is further coupled with the transmitter system to transmit the reader output signal.

10. The radiofrequency transceiver system of claim 4, wherein N=8.

11. The radiofrequency transceiver system of claim 9, further comprising:

an integrated circuit having integrated thereon:

the transmitter system;

the antenna; and a receiver system comprising the clock extractor, the oscillator controller, the multiphase selector, and the single-path detector.

12. A system for peak-adaptive sampling demodulation in a radiofrequency transceiver, the system comprising:

means for generating a plurality of clock output signals responsive to a clock input signal extracted from a received tag input signal, such that each clock output signal has a different respective phase, by applying an adjustable phase delay to the clock input signal to output a delayed clock input signal responsive to a delay control signal generated responsive to comparing a reference clock signal and the delayed clock input signal, by phase-synchronizing the plurality of clock output signals according to the delayed clock input signal, and by frequency-synchronizing the plurality of clock output signals according to the reference clock signal;

means for selectively outputting one of the plurality of clock output signals in response to determining that the one of the plurality of clock output signals has the respective phase that is closest, relative to the respective phases of others of the plurality of clock output signals, to a phase of the tag input signal; and means for outputting a data output signal generated by sampling the tag input signal responsive to the one of the plurality of clock output signals.

13. A method for peak-adaptive sampling demodulation in a radiofrequency transceiver, the method comprising:

receiving a tag input signal;

extracting a clock input signal from the tag input signal;

outputting a delayed clock input signal by applying, to the clock input signal, an adjustable phase delay that is responsive to a delay control signal, the delay control signal generated responsive to comparing a reference clock signal and the delayed clock input signal;

generating a plurality of clock output signals responsive to the clock input signal, such that each clock output signal has a different respective phase, by phase-synchronizing the plurality of clock output signals according to the delayed clock input signal and frequency-synchronizing the plurality of clock output signals according to the reference clock signal;

determining one of the plurality of clock output signals as having the respective phase that is closest, relative to the respective phases of others of the plurality of clock output signals, to a phase of the tag input signal;

outputting a peak sampling clock signal corresponding to the one of the plurality of clock output signals; and outputting a data output signal generated by sampling the tag input signal responsive to the peak sampling clock signal.

14. The method of claim 13, further comprising:
harmonically filtering the tag input signal,
wherein the extracting the clock input signal, the determining the one of the plurality of clock output signals, the outputting the peak sampling clock signal, and the outputting the data output signal are responsive to the tag input signal subsequent to the harmonically filtering.

15. The method of claim 13, wherein the outputting the data output signal comprises:
sampling the tag input signal responsive to the peak sampling clock signal to generate a sampled data signal; and
generating the data output signal by filtering and amplifying the sampled data signal.

16. The method of claim 13, wherein the generating the plurality of clock output signals comprises:
generating N clock output signals to each have a respective one of N phases using a fractional-N phase-locked loop (PLL) that oscillates, responsive to the clock input signal, at a PLL frequency that is approximately N times a frequency of the tag input signal, N being a positive integer.

17. The method of claim 13, further comprising:
generating the reference clock signal by a local oscillator,
wherein the generating the plurality of clock output signals is further responsive to the reference clock signal.

18. The method of claim 13, further comprising:
generating a reader output signal; and
transmitting the reader output signal by an antenna over a radiofrequency communication channel,
wherein the receiving is by the antenna over the radiofrequency communication channel in response to the transmitting.

* * * * *